United States Patent [19]
Kelley et al.

[11] Patent Number: 6,018,248
[45] Date of Patent: Jan. 25, 2000

[54] FRAME FOR HOLDING A BLADED ELEMENT OF AN IC HANDLING SYSTEM

[75] Inventors: Mark P. Kelley, San Jose; Yakov A. Bobrov, San Francisco, both of Calif.

[73] Assignee: Cirrus Logic, Inc., Fremont, Calif.

[21] Appl. No.: 08/845,943

[22] Filed: Apr. 29, 1997

Related U.S. Application Data

[62] Division of application No. 08/764,965, Dec. 13, 1996, Pat. No. 5,869,976.

[51] Int. Cl.⁷ .................................................. G01R 31/02
[52] U.S. Cl. ........................................ 324/755; 324/158.1
[58] Field of Search .................................. 324/755, 754, 324/760, 158.1; 439/73, 331

[56] References Cited

U.S. PATENT DOCUMENTS

| | | | |
|---|---|---|---|
| 3,391,383 | 7/1968 | Antes | 324/158.1 |
| 4,509,810 | 4/1985 | Erlam et al. | 439/76.1 |
| 4,560,216 | 12/1985 | Egawa | 439/331 |
| 4,615,441 | 10/1986 | Nakamura | 206/329 |
| 4,758,176 | 7/1988 | Abe et al. | 439/331 |
| 5,009,608 | 4/1991 | Shipe | 439/331 |
| 5,086,269 | 2/1992 | Nobi | 324/760 |
| 5,226,826 | 7/1993 | Nillson et al. | 439/73 |
| 5,244,404 | 9/1993 | Kishi et al. | 439/331 |
| 5,331,284 | 7/1994 | Jean et al. | 324/639 |
| 5,387,120 | 2/1995 | Marks et al. | 439/331 |
| 5,517,125 | 5/1996 | Posedel et al. | 324/760 |
| 5,519,332 | 5/1996 | Wood et al. | 324/755 |
| 5,562,473 | 10/1996 | Ikeya et al. | 439/331 |
| 5,634,267 | 6/1997 | Farnworth et al. | 29/840 |
| 5,729,147 | 3/1998 | Schaff | 324/755 |

*Primary Examiner*—Ernest Karlsen
*Attorney, Agent, or Firm*—Greenberg Traurig; Robert P. Bell

[57] ABSTRACT

A frame for holding a bladed element of a test socket is used in an IC handling system. The frame includes a face, a rim formed on the face, a detent formed on the rim so that the rim and the detent are capable of holding the bladed element. The detent includes a hook having a beveled edge for holding the bladed element.

4 Claims, 6 Drawing Sheets

FRAME FOR HOLDING A BLADED ELEMENT OF AN IC HANDLING SYSTEM

This patent application is a divisional of U.S. patent application Ser. No. 08/764,965, filed Dec. 13, 1996, now U.S. Pat. No. 5,869,976.

FIELD OF THE INVENTION

This invention relates to automated integrated circuit (IC) testing and more particularly to IC handling systems.

BACKGROUND OF THE INVENTION

Integrated circuits (IC) virtually never wear out. Failure of an IC is more often due to misuse or to a manufacturing defect. Misuses such as excessive vibration, water damage, and extreme heat are difficult for a manufacturer to control. However, manufacturing defects seen by consumers may be minimized by proper quality control. IC's often undergo extensive testing. Such testing seeks to identify defective IC's before the IC is used in a circuit board or other device. Testing should be as efficient and effective as possible.

High-speed IC testing systems have been developed which rely upon a high-speed robotic handler. The handler moves discrete IC packages into and out of an IC test socket to enable electronic tests to be performed on the IC before the IC is attached to a circuit board or other device. Hi-speed robotic handlers, come in various configurations. Many include a workpress assembly which couples IC packages to the test socket base.

A typical prior art workpress assembly is illustrated by FIG. 1 which shows a known IC handling workpress. The workpress includes a bladed element which bolts directly to a portion of the workpress. The bladed element is machined having four blades. The workpress includes a vacuum cup which extends through the bladed element between the blades. The blades function to align IC packages with a test socket base.

IC packages include multiple conductive leads. The workpress blades press the leads against the test socket base during testing. Ideally, the blades precisely and uniformly press the leads into the test socket to prevent lead damage. This ideal situation is sometimes unmet. What is desired is a workpress which is precision made and which does not damage leads during high-speed IC testing.

After extended periods of high-speed IC testing, the blades may wear. When blade wear exceeds a certain acceptable limit, the workpress assembly may fail to properly align the leads with the test socket. Worn blades may deform or break the leads. Blades which are worn beyond the acceptable limit are normally replaced before the blades damage the IC's to be tested. Blade replacement is expensive. What is desired is a way of reducing the cost of blade replacement.

The blades are often custom fabricated, having a size and shape to accommodate a particular IC package size. Custom fabricated blades are normally custom machined to desired specifications. This machining process is often performed by a specialized machine shop and is relatively expensive. Using a specialized machine shop for blade fabrication may ultimately increase product costs for consumers. What is desired is a way to eliminate the need for custom fabricated blades so that consumers may save money.

The test sockets used in many IC handling systems are commercially available. Examples of test sockets are disclosed in U.S. Pat. Nos. 5,009,608; 4,615,441; 4,758,176 and 5,387,120, the disclosures of which are incorporated herein by reference. Normally each test socket includes a test socket base and a test socket cover. The test socket cover includes a clamp which applies uniform pressure to the periphery of the packaged IC when the cover is closed. The cover of these test sockets is closed by hand.

One known method utilizes IC test socket bases for use with high-speed automated IC testing. This involves removal of the test socket top cover. The top cover is then discarded and wasted. The base is attached to the automated test system and is used for automated IC testing. What is desired is a way to recycle at least a portion of the top cover instead of discarding the top cover.

SUMMARY OF THE INVENTION

There is a need to reduce the costs of manufacturing IC's. One cost associated with the manufacture of IC's is testing. This need and others are met by the present invention. The present invention eliminates the need for an expensive machining process and recycles a part of a test socket which normally would be discarded--thereby, preserving resources.

The present invention includes a frame for holding a bladed element of an IC handling system. The frame is specially formed and includes a face, a rim and a detent. The rim is formed on the face for aligning a bladed element with respect to the frame. The detent is formed on the rim. The rim and the detent cooperate to hold the bladed element.

In a preferred embodiment of the invention, the detent includes a hook. The hook includes a beveled edge for holding the bladed element. The rim extends along three sides of the face. The rim defines bolt holes so that a bolt may extend through the bladed element and through the rim to hold the bladed element. The hook and the bolts cooperate to hold the bladed element.

In a further preferred embodiment, the frame is attachable as part of an IC handling workpress assembly. In particular, the frame is attachable to a workpress assembly. A test socket clamp attaches to the frame. The clamp includes the bladed element. The bladed element has blades for coupling an IC package to a test socket base.

The test socket clamp is formed from a portion of a test socket top cover. Forming the workpress assembly from a portion of a hand test socket top cover assures proper alignment between the blades and the test socket base.

In a further preferred embodiment, the test socket top cover includes a test socket clamp having hinge mounts. The hinge mounts fixedly attach the test socket clamp to the frame. The hinge mounts have threaded holes and bolts. The bolts extend through the threaded holes to bolt the test socket clamp to the frame. The frame includes a hook which holds the test socket cover on the frame. The hook is configured for gripping a portion of a blade.

In a further preferred embodiment, the workpress assembly includes a bladed element with four blades arranged in a rectangular format. Each blade is formed having a beveled surface and a contact edge. The hook has a beveled edge which conforms to the beveled surface of one blade. The beveled edge of the hook contacts the beveled surface of the one blade to attach the test socket clamp to the frame.

The foregoing and other feature, aspects, and advantages of the present invention will become more apparent from the following detailed description of the present invention. When taken in conjunction with the accompanying drawings.

BRIEF DESCRIPTION OF THE DRAWING

For a further understanding of the advantages of the present invention, reference should be given to the following detailed description, taken in conjunction with the accompanying drawing, in which like parts have like reference numerals and wherein.

DETAILED DESCRIPTION

Figure 1:
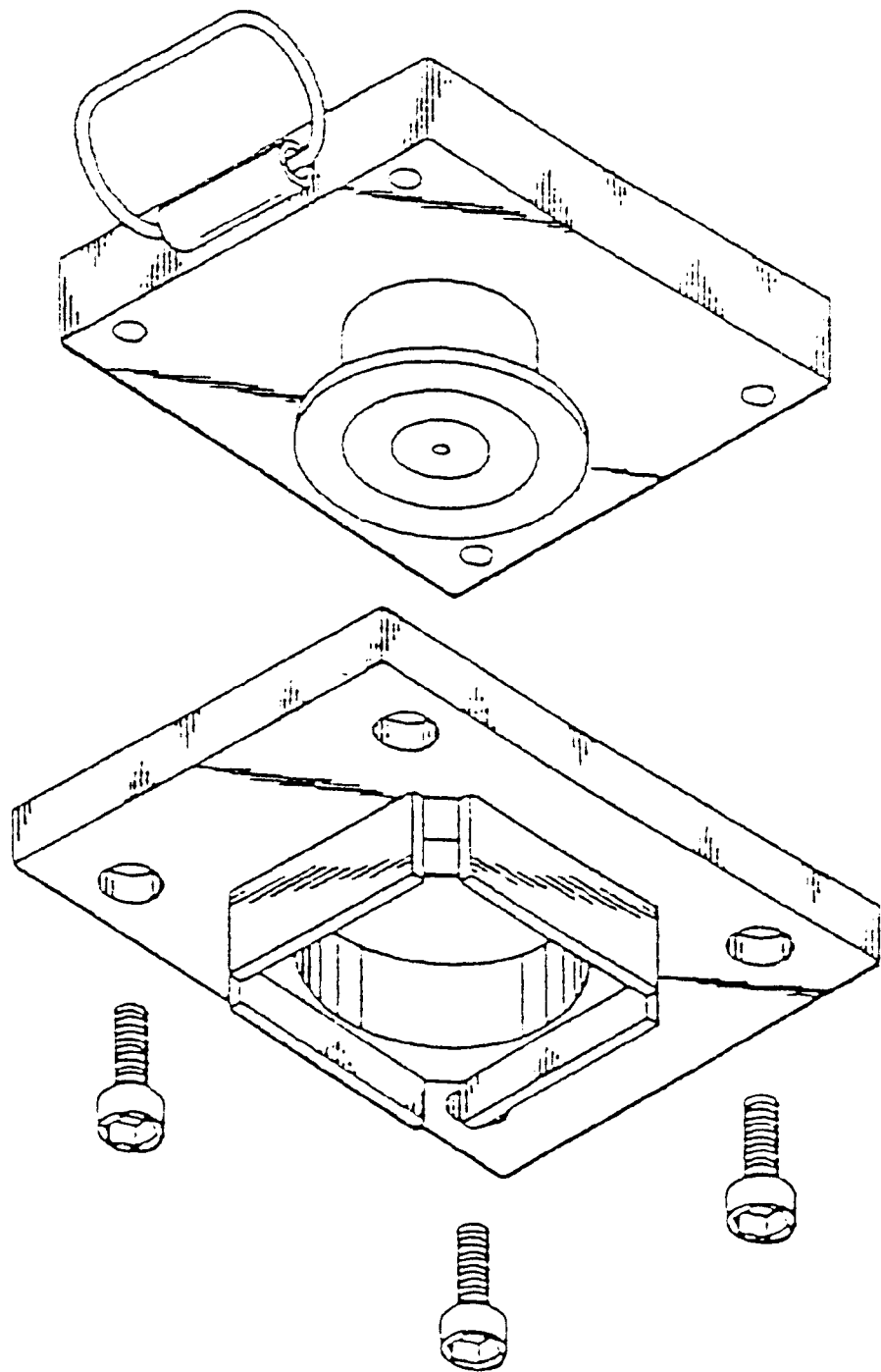
FIG. 1 is an exploded perspective view of a prior art workpress assembly having blades.
Figure 2:
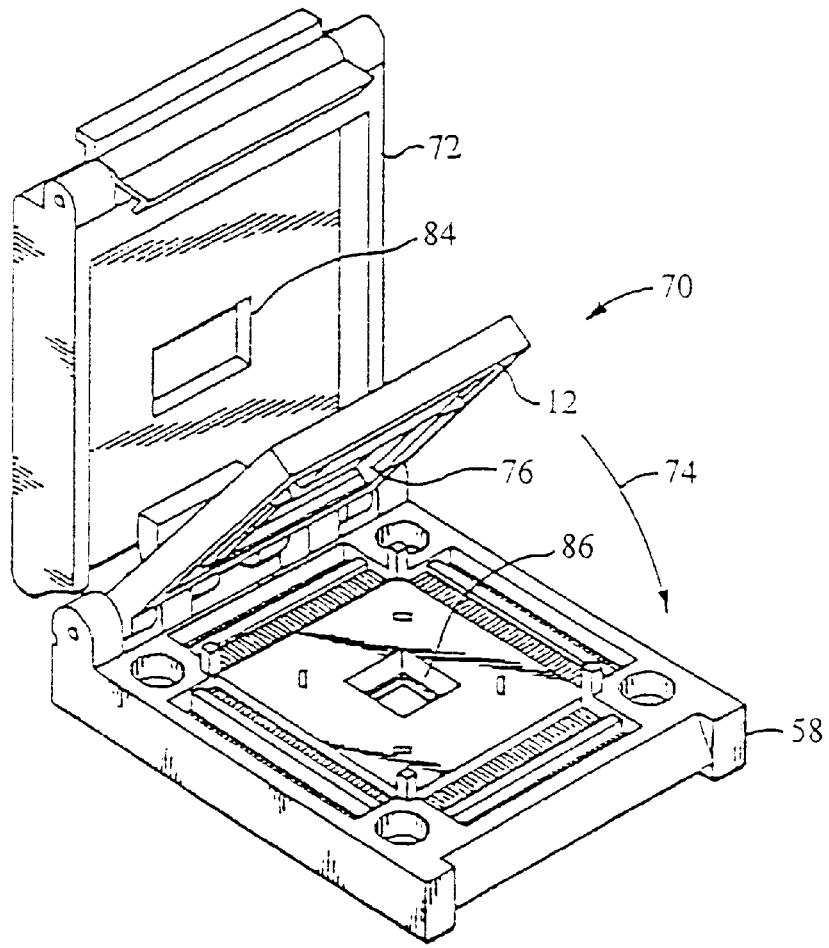
FIG. 2 is a perspective view of a known test socket.

FIG. 2 shows a test socket generally designated with the reference numeral 70. The test socket 70 is in an open configuration. The test socket 70 includes the base 58 and a top cover 72. The top cover 72 includes the clamp 12. The top cover 72 and clamp 12 rotate to close against the base 58 in the direction of the arrow 74.

The test socket 70 may serve a variety of functions. The test socket, for example, may serve as an IC storage and shipping container. A test socket may be used to package IC's. The base of a test socket may be used for IC burn-in testing. Various types of test sockets 70 are commercially available. Examples of test sockets are described in U.S. Pat. Nos. 5,009,608; 4,615,441; 4,758,176 and 5,387,120, the disclosures of which are incorporated herein by reference.

The test socket clamp 12 defines a rectangular opening 76. The opening 76 aligns with rectangular openings 84 and 86 in the top cover 72 and in the base 58, respectively. The openings 76,84 and 86 enable an IC to be viewed within the test socket 70 when the cover 72 closes. Although the present invention is described in conjunction with a test socket clamp having a top cover 72 with a clamp 12, any of a variety of test sockets having a clamp, may be modified in accordance with the present invention.

Figure 4:
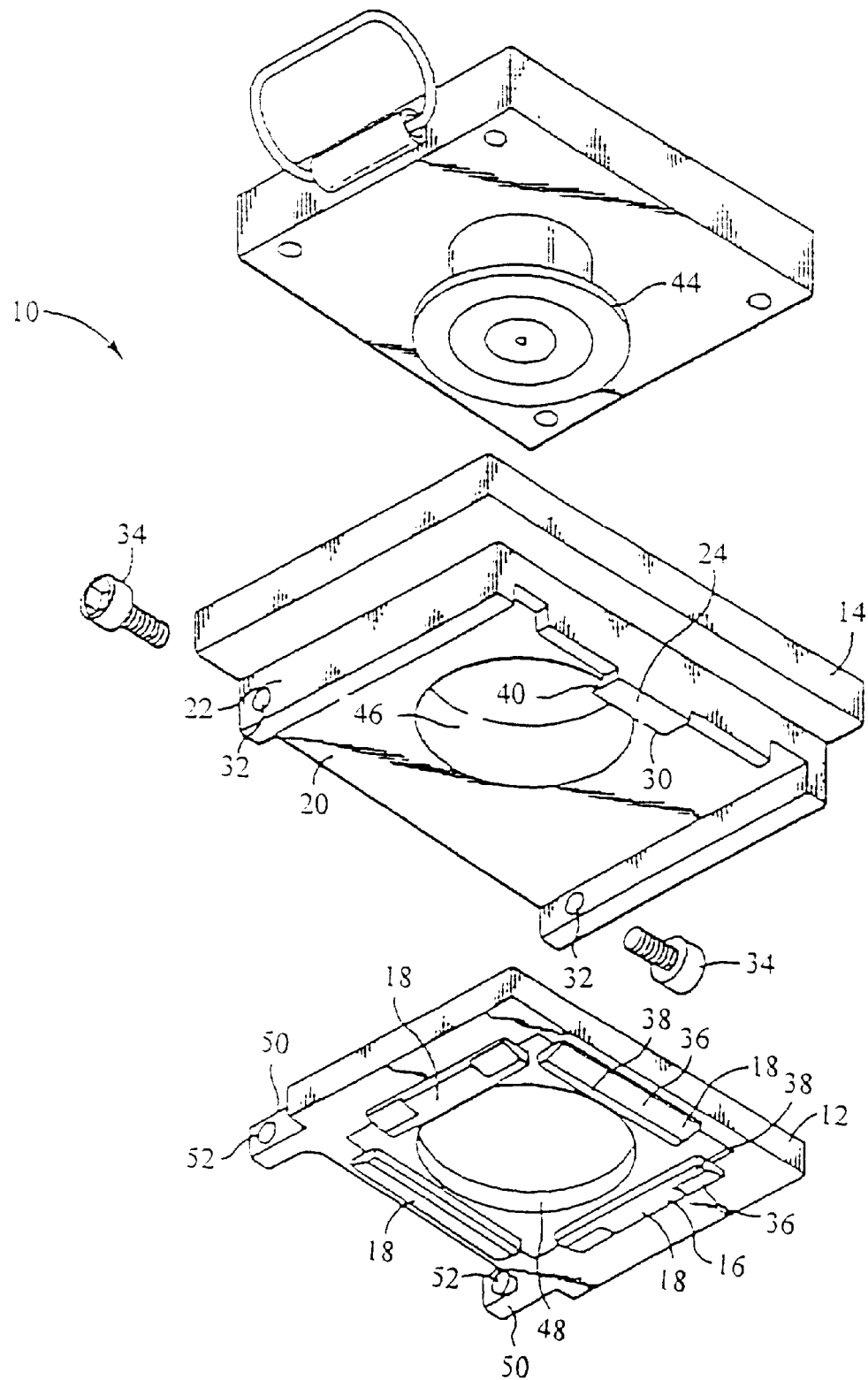
FIG. 4 is an exploded perspective view of a workpress assembly in accordance with the present invention.

FIG. 4 shows a workpress assembly generally designated with the reference numeral 10. The workpress assembly 10 includes a test socket clamp 12 and a frame 14. The frame 14 attaches the test socket clamp 12 to the workpress assembly 10 to enable the workpress assembly to use the test socket clamp for handling packaged IC's. One advantage of using a test socket clamp 12 with the frame 14 is to assure alignment between the workpress assembly and any IC to be handled. Another advantage is to recycle test socket clamps 12.

The frame 14 includes a face 20, a rim 22 and a detent 24. Accordingly, the frame 14 is particularly configured for holding the test socket clamp 12. The rim 22 is formed on the face 20. The face 20 is square, having four sides. The rim 22 extends along each of three sides of the face 20. The rim 22 aligns the bladed element 16 of the clamp 12 with respect to the frame 14. The detent 24 is formed on the rim 22 and is configured for holding the clamp 12 and the bladed element 16. The detent 24 includes a hook 30. The rim 22 defines bolt holes 32 and includes blots 34. The hook 30 and the bolts 34 cooperate to hold the test socket clamp 12 on the frame 14.

The test socket clamp 12 includes a bladed element 16 which has blades 18 for coupling an IC package to a test socket base. The blades 18 are arranged in a rectangular format. Each blade 18 is formed with a beveled surface 36 and a contact edge 38. The contact edge 38 is configured for pressing against IC leads without damaging the leads.

The hook 30 has a beveled edge 40 which conforms to the beveled surface 36 of one blade 18. The beveled edge 40 of the hook 30 contacts the beveled surface 36 of the one blade 18 to precisely hold the test socket clamp 12 in fine alignment on the frame 14.

The workpress assembly 10 includes a vacuum cup 44. The frame 14 defines a central opening 46. The clamp 12 defines a central opening 48 which aligns with the opening 46 of the frame 14. The vacuum cup 44 extends through the workpress assembly 10, the frame 14 and the clamp 12 to grip packaged IC's.

Forming the workpress assembly 10 from the clamp 12 of a hand test socket top cover 40 assures fine and precise alignment between the blades 18 and an IC to be handled. Precise alignment minimizes the probability of IC lead damage.

According to one aspect of the invention, the test socket clamp 12 is formed from a portion of a test socket top cover. Forming the clamp 12 from a test socket top cover reduces waste by utilizing top covers which are not normally recycled. The test socket clamp 12 includes hinge mounts 50. The hinge mounts 50 are originally designed to rotatably attach the clamp 12 with a test socket base. In accordance with this aspect of the invention, the hinge mounts 50 are used to affix the test socket clamp 12 to the frame 14.

The hinge mounts 50 have threaded holes 52. The bolts 34 extend through the threaded holes 52 to bolt the test socket clamp 12 to the rim 22 of the frame 14. Accordingly, the hook 30 and the hinge mounts 50 cooperate to affix the test socket clamp 12 to the frame 14.

Figure 3:
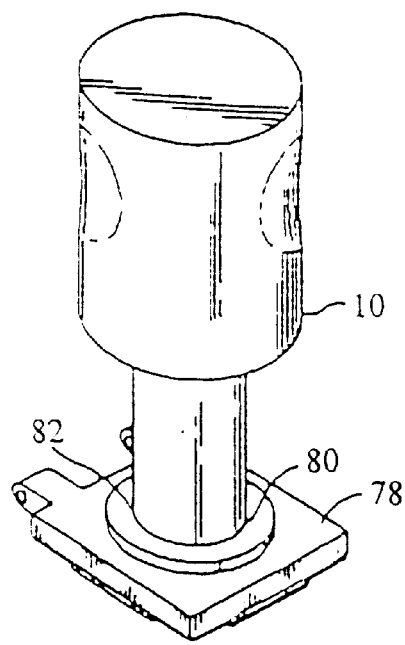
FIG. 3 is an exploded perspective view of an embodiment of a workpress assembly in accordance with the present invention.

FIG. 3 is an alternate embodiment of a test socket clamp 78 attached directly to a portion of a workpress assembly 10. The clamp 78 has an inner periphery 80 which defines a central opening 82. The inner periphery 80 is threaded for threadibly attaching the clamp 78 directly to the workpress assembly 10.

Figure 5:
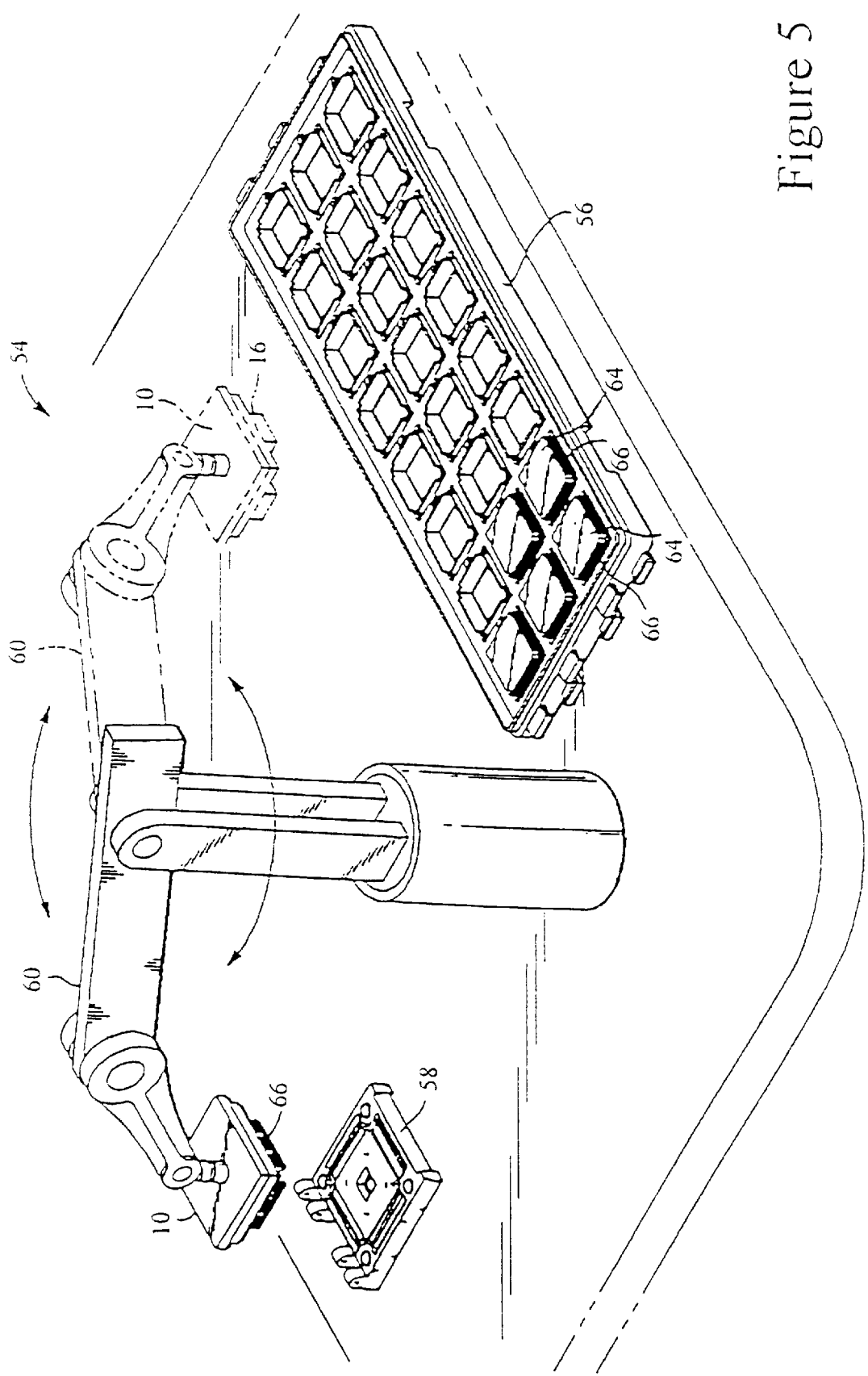
FIG. 5 is a perspective view of a system in accordance with the present invention.

FIG. 5 shows a high-speed IC handling system in accordance with the present invention and generally designated with the reference numeral 54. The handling system 54 includes the workpress assembly 10, a tray 56, and a test socket base 58.

The tray 56 holds packaged IC's 64. The workpress assembly 10 has an arm 60 which moves the IC's 64 from the tray 56 to the test socket base 18. The arm 60 rotates between a first position (shown in phantom) where the arm 60 extends over the tray 56 to and a second position where the arm 60 extends over the test socket base 18.

In the first position, the arm 60 lowers the workpress assembly 10 and enables the workpress assembly 10 to grip a packaged IC 64. The arm 60 lifts the workpress assembly 10 and rotates to move the packaged IC 64. In the second position, the arm 60 lowers the workpress assembly 10 to place the packaged IC 64 in the test socket base 18. This process repeats.

The test socket base 58 tests the packaged IC's 64. Each packaged IC 64 has a plurality of conductive leads 66. The workpress assembly 10 is specially adapted to minimize any damage to the leads 66 during insertion of the packaged IC 64 into the test socket base 18. In particular, the workpress assembly 10 includes the bladed element 16.

When the arm 60 is in the second position, the bladed element 16 aligns the leads with the test socket base 58. The bladed element 16 also and precisely applies force onto the leads 66 of the packaged IC 64 to couple the leads 66 to the test socket base 18.

According to one aspect of the invention, the bladed element 16 is formed from a portion of a test socket top cover. Forming the bladed element 16 formed from a portion of a test socket top cover assures proper alignment between the bladed element 16 and the test socket base 18. Additionally, forming a bladed element 16 from a portion of a test socket top cover minimizes manufacturing expenses which are associated with the manufacture of bladed elements. Further, the test socket top covers are typically fabricated to close tolerances. Using a test socket cover as part of the workpress assembly 10 assures precise alignment between the IC 64 and the test socket base 58; assures manufacturing integrity and that close tolerances will be met; and assures that the leads 66 will not be damaged.

In Operation

Figure 6:
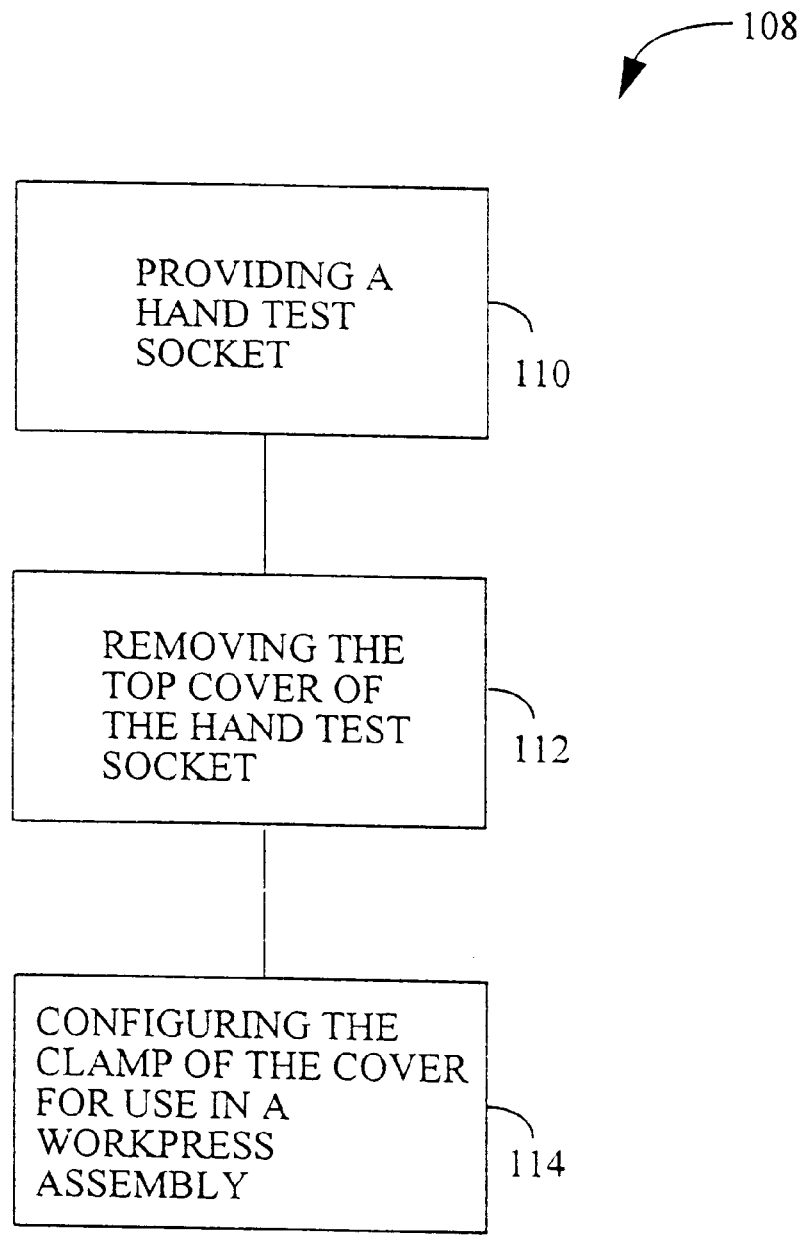
FIG. 6 is a flowchart of a method in accordance with the present invention.

FIG. 6 shows a flowchart of a method in accordance with the present invention generally designated with the reference numeral 108. The method 108 includes the step 110 of providing a hand test socket having a base and a top cover having a clamp. Next, the step of 112 of removing the top cover is performed. The step 114 of configuring the clamp for use in a workpress assembly follows the step of removing.

According to one aspect of the invention, the test socket clamp has a rectangular opening. The step 114 of configuring the clamp includes the step of replacing the rectangular opening with a circular opening. The circular opening enables a portion of the workpress assembly extend through the clamp.

The clamp defines an inner periphery. The step 114 of configuring the clamp includes boring a central opening in the clamp and forming threads on the inner periphery. The inner periphery defines the central opening. An additional step in accordance with the present invention includes threads the hand test socket to the workpress assembly.

Figure 7:
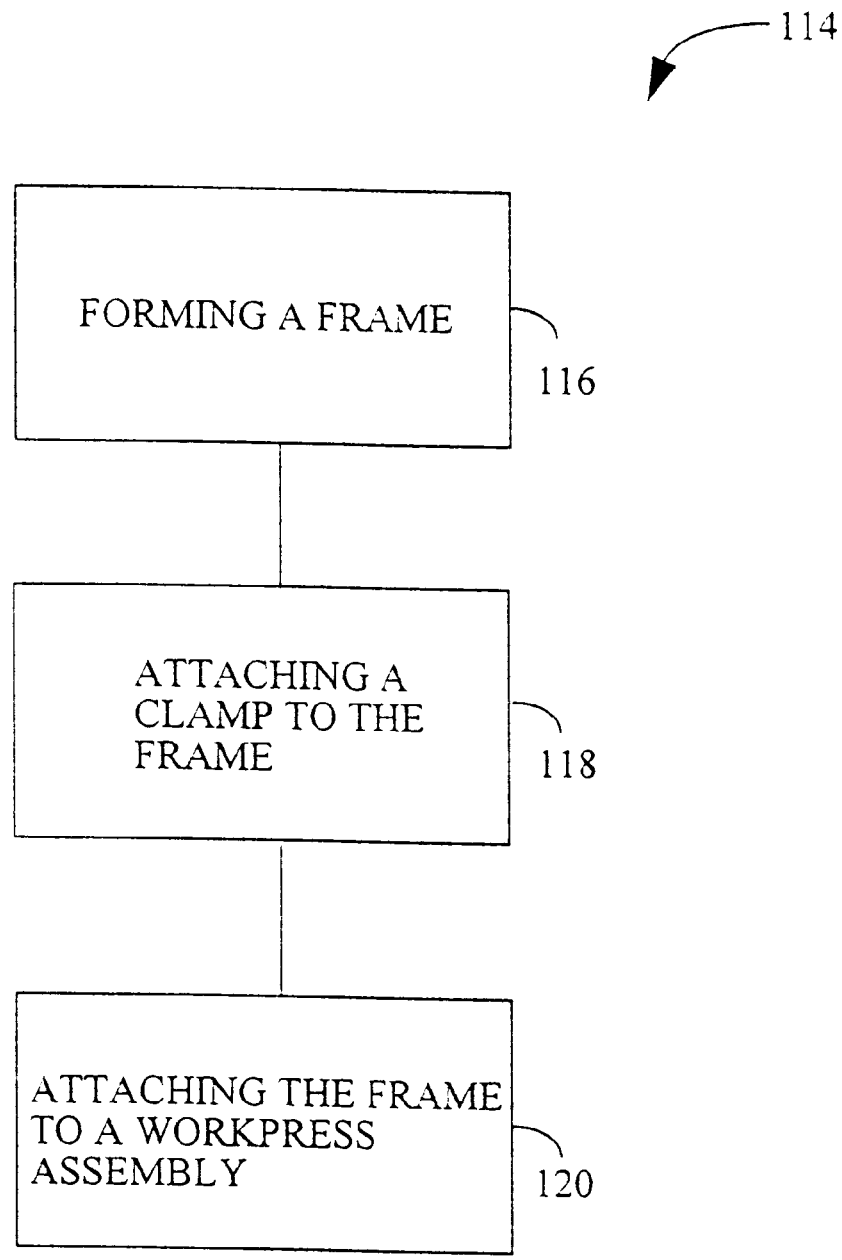
FIG. 7 is a flowchart of a method in accordance with the present invention.

FIG. 7 shows a flowchart of a variation of the step 114 of configuring the clamp. This includes the step 116 of forming a frame, and the step 118 of attaching the clamp to the frame. The step 120 of attaching the frame to a workpress assembly enables the workpress assembly to employ the clamp.

The step 116 of forming a frame includes forming a rim on the frame and boring bolt holes in the rim. The step of forming the rim of the frame includes forming a detent including a hook on the rim. The hook has an edge. The method includes beveling the edge of the hook.

According to one aspect of the invention, the workpress assembly includes a portion having a vacuum cup. The vacuum cup extends through the clamp. The step of attaching includes extending the vacuum cup through the clamp and threadibly attaching the clamp to the portion of the workpress assembly having the vacuum cup.

While the foregoing detailed description has described several embodiments in accordance with the present invention, understand that the above description is illustrative only and not limiting of the disclosed invention. For example, the bladed element may attach in any of a number of ways to a workpress assembly. Additionally, virtually any clamp may be adapted from any number of test sockets having a cover. It will be appreciated that the embodiments discussed above and the virtually infinite embodiments that are not mentioned could easily be within the scope and spirit of this invention. Thus, the invention is to be limited only by the claims as set forth below.

We claim:

1. A frame for adapting a hand test socket for use in a workpress assembly by providing a hand test socket having a base and a top cover including a clamp, removing the top cover and the clamp, and configuring the clamp for use in a workpress assembly by providing a frame for holding the clamp, said frame comprising:

a face;

a rim formed on the face;

a detent formed on the rim; and a hook, whereby, the rim and the detent are capable of holding the bladed element;

wherein the rim surrounds a least a portion of the clamp and the clamp is attached to the frame using at least a portion of the rim to engage a corresponding portion of the clamp and hooking the clamp to the frame using the hook portion.

2. A frame as set forth in claim 1, wherein the hook include a beveled edge for holding the bladed element.

3. A frame as set forth in claim 1, wherein the rim defines bolt holes for receiving bolts, the hook and the bolt holes cooperate to hold the bladed element.

4. A frame as set forth in claim 1, wherein the rim extends along three sides of the face.

* * * * *